(12) United States Patent
Huang

(10) Patent No.: US 6,661,089 B2
(45) Date of Patent: Dec. 9, 2003

(54) SEMICONDUCTOR PACKAGE WHICH HAS NO RESINOUS FLASH FORMED ON LEAD FRAME AND METHOD FOR MANUFACTURING THE SAME

(75) Inventor: Chien-Ping Huang, Chutung Chen Hsien (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 10/137,834

(22) Filed: May 3, 2002

(65) Prior Publication Data

US 2002/0130398 A1 Sep. 19, 2002

Related U.S. Application Data

(62) Division of application No. 09/663,990, filed on Sep. 18, 2000, now Pat. No. 6,429,047.

(30) Foreign Application Priority Data

May 19, 2000 (TW) ..................................... 89109620 A

(51) Int. Cl.[7] .............................................. H01L 23/48
(52) U.S. Cl. ........................ 257/704; 257/667; 257/669
(58) Field of Search ................................. 257/667, 669, 257/674, 704, 685, 686, 723, 777; 361/813, 820, 723

(56) References Cited

U.S. PATENT DOCUMENTS

| 5,070,041 | A |   | 12/1991 | Katayama et al. |        |
|-----------|---|---|---------|-----------------|--------|
| 5,268,533 | A | * | 12/1993 | Kovacs et al. ............. | 174/52.4 |
| 5,387,815 | A | * | 2/1995  | Nidhiguchi ................. | 257/704 |
| 5,523,608 | A |   | 6/1996  | Kitaoka et al.  |        |
| 5,729,049 | A | * | 3/1998  | Corisis et al. ............... | 257/676 |
| 5,874,773 | A | * | 2/1999  | Terada et al. ................ | 257/676 |
| 5,917,234 | A | * | 6/1999  | Tsuruzono .................. | 257/667 |
| 6,020,625 | A | * | 2/2000  | Qin et al. .................... | 257/666 |
| 6,054,755 | A | * | 4/2000  | Takamichi et al. .......... | 257/667 |
| 6,147,397 | A | * | 11/2000 | Burns et al. ................. | 257/669 |
| 6,191,490 | B1| * | 2/2001  | Huang ......................... | 257/782 |
| 6,288,904 | B1| * | 9/2001  | Houdeau et al. ............ | 361/760 |
| RE37,690  | E | * | 5/2002  | Kitano et al. ................ | 257/666 |
| 6,387,732 | B1| * | 5/2002  | Akram ......................... | 438/123 |
| 6,396,142 | B1| * | 5/2002  | Ito et al. ...................... | 257/712 |

* cited by examiner

Primary Examiner—Kamand Cuneo
Assistant Examiner—Lourdes Cruz
(74) Attorney, Agent, or Firm—Peter F. Corless; Steven M. Jensen; Edwards & Angell, LLP

(57) ABSTRACT

Disclosed is a semiconductor package which has no resinous flash formed on a lead frame and its manufacturing method. The method includes the steps of preparing a lead frame having a first surface and a second surface, attaching an adhesive tape capable of being easily removed on the second surface of the lead frame, attaching a first semiconductor chip on the lead frame and electrically connecting the first semiconductor chip with the lead frame, performing a molding process to form a resin molded block on the first surface of the lead frame for covering the first semiconductor chip, removing the adhesive tape, attaching a second semiconductor chip on the second surface and electrically connecting the second semiconductor chip with the lead frame, attaching a frame with a hollow portion on a predetermined position of the second surface of the lead frame by an adhesive agent and containing the second semiconductor chip in the hollow portion, and bonding a covering member on the frame to seal the hollow portion for isolating the second semiconductor chip from outside.

8 Claims, 5 Drawing Sheets

SEMICONDUCTOR PACKAGE WHICH HAS NO RESINOUS FLASH FORMED ON LEAD FRAME AND METHOD FOR MANUFACTURING THE SAME

CROSS-REFERENCE TO RELATED APPLICATION(S)

This application is a divisional of application U.S. Ser. No. 09/663,990, filed on Sep. 18, 2000, now U.S. Pat. No. 6,429,047.

FIELD OF THE INVENTION

The present invention is related to a semiconductor package and its manufacturing method, and especially to a semiconductor package in which a semiconductor chip is attached to a lead frame and a method for manufacturing the same.

BACKGROUND OF THE INVENTION

Currently, the structure of a semiconductor package, such as solid state image-sensing chip, photosensor, or ultraviolet erasable EP-ROM, includes a premolded resin block disposed ion the lead frame and having a concavity for exposing a portion of the lead frame in the resin molded block to allow the chip to be attached thereon and allow gold wires to be bonded thereon. After an image-sensing chip is directly attached to a predetermined position of the lead flame and electrically connected to the lead frame through gold wires, a covering member is bonded to the resin molded block so as to seal hermetically the whole concavity, thereby isolating the image-sensing chip and gold wires from outside. For example, U.S. Pat. No. 5,070,041 discloses such an image-sensing semiconductor package.

At the same time, in order to meet the requirement of a light, thin, and small electronic product with multiple functions, another chip with a different function is embedded in the above-described semiconductor package, as disclosed in U.S. Pat. No. 5,523,608. As shown in FIG. 8, U.S. Pat. No. 5,523,608 discloses a semiconductor package 1 having a chip 11 with peripheral pads attached on the bottom surface 100 of the lead frame 10. After the chip 11 is electrically connected to the lead frame 10 through gold wires 12, the lead frame 10 having a chip 11 attached thereon is placed in a package mold (not shown) to form a resin molded block 13 embedding the chip 11 and the gold wires 12 therein. When the resin molded block 13 is formed, a concavity 130 is formed on the top surface 101 of the lead frame 10 relative to the attaching position of the chip 11. The top surface 101 of the lead frame 10 is partially exposed in the concavity 130 so as to directly attach an image-sensing chip 14 to the lead frame 10 through the concavity 130. After the image-sensing chip 14 is electrically connected to the lead frame 10 through gold wires 15, a covering member 16 is bonded on the resin molded block 13 to seal hermetically the whole concavity 130 to accomplish a manufacturing method of the semiconductor package 1 with a multi-chip module.

In the above-described semiconductor package, the resin molded block with a concavity is molded and formed on the lead frame for attaching the semiconductor chip thereon to allow the image-sensing chip to attach on a surface of the lead frame exposed in the concavity. Because the flash of the resin is often formed on the surface of the lead frame exposed in the concavity during the molding process, it will affect the quality of subsequent die-bonding and wire-bonding processes, thereby decreasing the reliability of the fabricated product unless the flash is removed. Therefore, U.S. Pat. No. 5,070,041 discloses a method of removing flash from the semiconductor lead frame. First of all, an organic high molecular substance is coated on the predetermined surface of the lead flame exposed in the concavity of the resin molded block. After completing the molding process and forming the resin molded block partially embedding the lead frame therein, the lead frame combined with the resin molded block is placed in a solvent to remove the organic high molecular coating layer and then the die-bonding and wire-bonding processes are performed. However, such a method of immersing the lead frame combined with the resin molded block in the solvent which can dissolve the organic high molecular substance is time-consuming and complicated. Furthermore, the solvent containing the organic high molecular substance will result in an environmental pollution thereby increasing the processing cost.

U.S. Pat. No. 5,523,608 adopts a blasting way to remove the flash on the lead frame. Besides that the blasting way for removing the flash is time-consuming and requires an additional equipment thereby resulting in an increased cost, the flash particles separating from the surface of the lead flame will spray and adhere to the package equipment. If the flash particles cannot be effectively removed, they will influence the reliability of the next operation. Therefore, the package equipment must be also cleaned thereby further complicating the cleaning work. Moreover, during the blasting process, when a high-speed flow (gas or liquid) generated at a high pressure is applied to the lead frame, it will damage the resin molded block and lead frame, or even the chip with peripheral pads attached on the back side of the lead frame, thereby affecting the reliability of the fabricated product. In addition, this semiconductor package has two chips, and the heat generated from the chips cannot be effectively dissipated thereby influencing the useful life of the chip.

During the molding process of the above-described semiconductor package, the concavities in the upper mold and the lower mold of the used package mold are not symmetrical so that the resin flows for forming the resin molded block are respectively introduced into the concavities in the upper mold and the lower mold at different flow rates. It will easily cause the occurrence of void or popcorn. In addition, in the packaging process disclosed in U.S. Pat. No. 5,523,608, the resin flows respectively introduced into the concavities in the upper mold and the lower mold at different flow rates also easily result in wire sweep of gold wires bonded on the chip with peripheral pads disposed in the lower mold, such that short circuiting will likely occur due to the gold wires contacting each other.

SUMMARY OF THE INVENTION

An object of the present invention is to provide a method of removing flash from the semiconductor package, which can simplify the manufacturing process and decrease the manufacturing cost.

Another object of the present invention is to provide a semiconductor package and its manufacturing method which can enhance the heat-dissipating efficiency.

Yet another object of the present invention is to provide a semiconductor package and its manufacturing method which can prevent the occurrence of popcorn that can influence the reliability of products.

A further object of the present invention is to provide a semiconductor package and its manufacturing method without the problem of environmental pollution.

In accordance with one aspect of the present invention, the method includes the steps of preparing a lead frame having a first surface and a second surface, attaching an adhesive tape capable of being easily removed on the second surface of the lead frame, forming a resin molded block on a predetermined position of the first surface of the lead frame, removing the adhesive tape, attaching a semiconductor chip on a chip-adhering region of the second surface of the lead frame and electrically connecting the semiconductor chip with the lead frame, attaching a frame with a hollow portion on a predetermined position of the second surface of the lead frame by an adhesive agent and containing the semiconductor chip in the hollow portion, and bonding a covering member on the frame to seal the hollow portion for isolating the semiconductor chip from outside.

The method of the invention further includes steps after the step of attaching an adhesive tape on the second surface of the lead frame: attaching at least one semiconductor chip with peripheral pads to a predetermined position of the first surface of the lead frame, electrically connecting the at least one semiconductor chip with peripheral pads to the lead frame, and performing a molding process to form a resin molded block for covering the at least one semiconductor chip with peripheral pads. The semiconductor chip attached to the first surface of the lead frame can be a semiconductor chip with peripheral pads or a stacked structure having another semiconductor chip stacked on the semiconductor chip with peripheral pads. In the stacked structure, the semiconductor chip on the upper layer is electrically connected with the semiconductor chip on the lower layer through a solder bumps. Alternatively, the semiconductor chip on the upper layer is electrically connected with the semiconductor chip on the lower layer through gold wires, or is directly electrically connected with the semiconductor chip on the lower layer.

In the method of the present invention, because the second surface of the lead frame is attached by the adhesive tape 37, there is no resinous flash formed on the second surface of the lead frame during the molding process. After the adhesive tape is removed from the lead frame, the subsequent steps can be performed directly without requiring any additional cleaning step to remove the flash. At the same time, since the frame for containing the semiconductor chip in the hollow portion is premolded and then attached to the lead frame, the adhesion between the frame and the lead frame will not influence the connection between the semiconductor chip or conducting element and the lead frame. In addition, the frame is made of metallic material with a good thermal conductivity, such as copper, aluminum, copper alloy, aluminum alloy or the like, so that the heat generated by the semiconductor chip can be dissipated in the air. Thus, the semiconductor package of the present invention has a higher heat-dissipating efficiency. Moreover, because the resin molded block is only formed on the first surface of the lead frame, the problem of uneven flow rate of resin flow in the molding process can be prevented and no void is formed in the resin molded block.

In accordance with another aspect of the present invention, the semiconductor package includes a lead frame having a first surface and a second surface opposite to the first surface; a resin molded block formed on a predetermined position of the first surface of the lead frame; a frame attached to a predetermined position of the second surface of the lead frame by an adhesive agent and having a hollow portion for allowing a portion of the second surface of the lead frame exposed in the hollow portion to serve as a chip-adhering region; a semiconductor chip attached on the chip-adhering region and electrically connected with the lead frame; and a covering member bonded on the frame to seal the hollow portion for isolating the semiconductor chip from outside.

BRIEF DESCRIPTION OF THE DRAWINGS

The present invention may best be understood through the following description with reference to the accompanying drawings, in which.

DETAILED DESCRIPTION OF THE PREFERRED EMBODIMENT

The present invention will now be described in more detail with reference to the following embodiments. It is to be noted that the following descriptions of the preferred embodiments of this invention are presented herein for the purpose of illustration and description only. The described embodiments are not intended to be exhaustive, and the invention is not limited to the precise form disclosed.

FIRST PREFERRED EMBODIMENT

Figure 1:
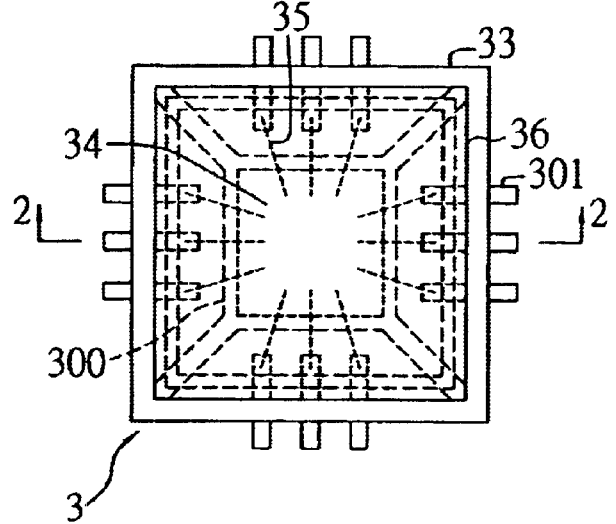
FIG. 1 is a bottom view of the first preferred embodiment of a semiconductor package of the present invention.
Figure 2:
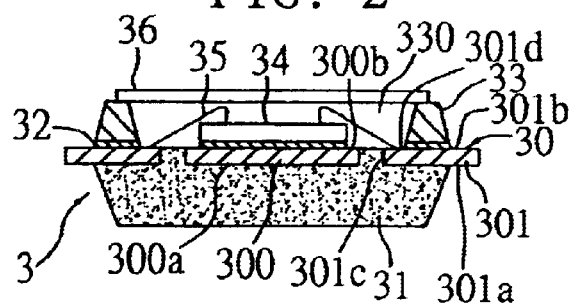
FIG. 2 is a sectional view of FIG. 1 taken along the line 2—2.

Please refer to FIGS. 1 and 2 which are bottom and sectional views of the first preferred embodiment of the semiconductor package of the present invention, respectively.

As illustrated, the first preferred embodiment of the semiconductor package 3 of the present invention includes a lead frame 30 consisting of a die pad 300 and a plurality of leads 301, wherein the die pad 300 has a bottom surface 300*a* and a top surface 300*b* opposite to the bottom surface 300*a*. Similarly, each of the plurality of leads 301 also has a bottom surface 301*a* and a top surface 301*b* opposite to the bottom surface 301*a*. There is a resin molded block 31 formed on the lower surface of the lead frame 30 for covering the bottom surface 300*a* of the die pad 300 and a portion of the bottom surfaces 301*a* of the leads 301. A frame 33 with a hollow portion 330 is attached to the upper surface of the lead frame 30 by an adhesive agent 32 so that the frame 33 and the lead frame 30 are adhered on the top surfaces 301*b* of the leads 301. The region on the top surface 301*b* of the lead 301 and from the inner end 301*c* to the adhesive position of the frame 33 is a bonding region 301*d*, and the top surface 300*b* of the die pad 300 and the bonding region 301d are exposed in the hollow portion 330. A semiconductor chip 34 is attached to the top surface 300b of the die pad 300 by a commonly used silver paste or polyimide tape and connected to the bonding region 301d of the lead 301 through a plurality of gold wires 35 such that the semiconductor chip 34 can be electrically connected to the lead frame 30. The covering member 36 is bonded on the frame 33 to seal the hollow portion 330 and isolate the semiconductor chip 34 and the gold wires 35 from outside. The covering member 36 can be made of transparent or opaque material such as glass, plastic, or metal.

The material of the frame 33 can be a metallic material with a good heat-dissipating property such as aluminum, copper, aluminum alloy or copper alloy, or a nonmetallic material such as resin, glass fiber, or ceramic. When the frame 33 is made of metallic material, the heat generated by the semiconductor chip 34 can be dissipated outwardly, thereby enhancing the heat-dissipating efficiency of the fabricated product.

The adhesive agent 32 for attaching the frame 33 to the leads 301 can be made of nonconducting material, for example, polyimide or epoxy resin. In order to increase the heat-dissipating efficiency of the semiconductor package 3, the adhesive agent 32 is preferably a thermally conducting adhesive such that it can be combined with the leads 301 and the frame 33 made of metallic material to construct a heat-dissipating structure with a good thermal conductivity. Preferably, the adhesive agent is a mixture of polyimide or epoxy resin and a ceramic filler.

The manufacturing process of the semiconductor package 3 is shown in FIGS. 3A to 3F.

Figure 3A:
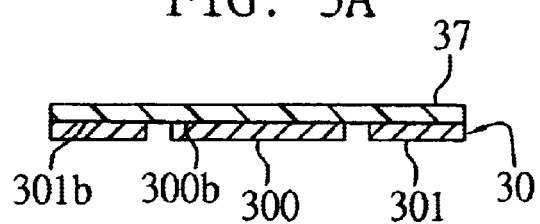
FIGS. 3A to 3F are schematic diagrams showing the flowchart of the method for manufacturing the first preferred embodiment of the semiconductor package of the present invention.

As shown in FIG. 3A, a lead frame 30 consisting of a die pad 300 and a plurality of leads 301 is prepared and an adhesive tape 37 capable of being easily ripped away is attached to an upper surface of the lead frame 30. The adhesive tape 37 is used to cover the top surface 300b of the die pad 300 and the top surface 301b of the lead 301. The adhesive tape 37 must be made of heat-resistant material such that the adhesive tape 37 will not be melted due to high temperature when the lead frame 30 having the adhesive tape 37 attached thereon is placed in the package mold for performing the molding process in order to ensure that the top surface 300b of the die pad 300 and the top surface 301b of the lead 301 can be attached by the adhesive tape 37 during the molding process.

Figure 3B:
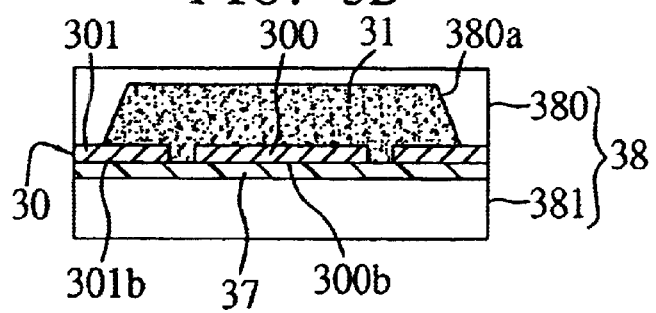

Thereafter, as shown in FIG. 3B, after the lead frame 30 having the adhesive tape 37 attached thereon is placed in the package mold 38 consisting of an upper mold 380 and a lower mold 381 for performing the transfer molding process, a resin molded block 31 is formed in the concavity 380a of the upper mold 380. At this time, because the top surface 300b of the die pad 300 and the top surface 301b of the lead 301 are tightly attached by the adhesive tape 37 such that there is no resinous flash formed on the top surface 300b of the die pad 300 and the top surface 301b of the lead 301 during the molding process.

Figure 3C:
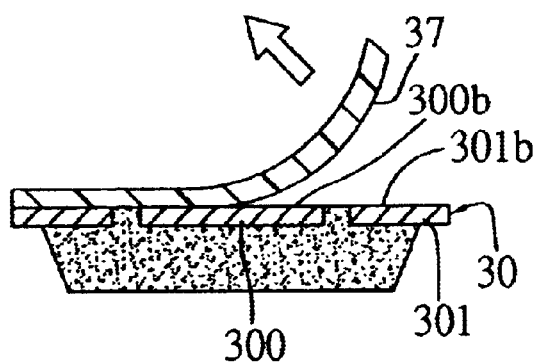

Please refer to FIG. 3C. After finishing the molding process, the adhesive tape 37 is ripped away from the lead frame 30 such that there is no resinous flash formed on the top surface 300b of the die pad 300 and the top surface 301b of the lead 301. Therefore, it does not require any step to clean the flash, and the subsequent die-bonding and wire-bonding processes can be directly performed. In comparison with the conventional package process, the method of the present invention can lower the manufacturing cost, simplify the steps, and enhance the reliability of fabricated products.

Figure 3D:
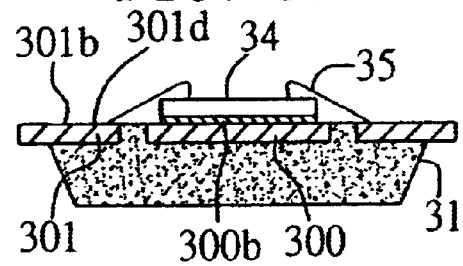

As shown in FIG. 3D, after the adhesive tape 37 is removed, an image-sensing semiconductor chip 34 is attached to the top surface 300b of the die pad 300 by an adhesive agent such as silver paste and connected to the bonding region 301d of the lead 301 through a plurality of gold wires 35 such that the semiconductor chip 34 can be electrically connected to an exterior device through the lead frame 30. Because there is no flash existing on the top surface 300b of the die pad 300 and the bonding region 301d of the lead 301, the adhesive qualities between the die pad 300 and semiconductor chip 34 and between the gold wires 35 and the lead 301 are ensured.

Figure 3E:
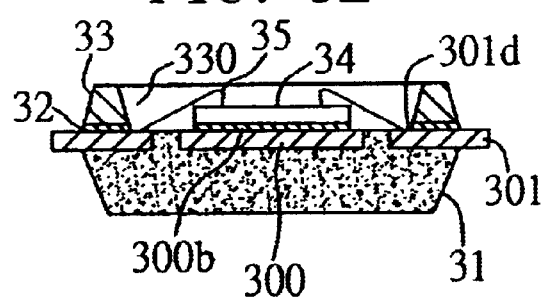

As shown in FIG. 3E, after accomplishing the above die-bonding and wire-bonding processes, a frame 33 with a hollow portion 330 is attached to a predetermined position outside of the bonding region 301d of the lead 301 by an adhesive agent 32. The semiconductor chip 34 and the gold wires 35 are contained in the hollow portion 330 of the frame 33. The altitude of the frame 33 must be higher than the top point of the wire loop of the gold wires 35 to ensure that the covering member 36 will not contact the gold wires 35 when it is bonded to the frame 33. Because the frame 33 is attached to the lead 301 rather than formed by a molding process, no contamination occurs on the bonding region 301d of the lead 301 for bonding the gold wires 35 thereon and on the top surface 300b of the die pad 300 for attaching the semiconductor chip 34 thereon, thereby enhancing the reliability of fabricated products. At the same time, because the frame 33 and the resin molded block 31 are molded separately, the occurrence of void resulting from the uneven flow rate of resin applied to the upper mold and the lower mold will be prevented. Thus, the product fabricated by the method of the present invention has a better reliability.

Figure 3F:
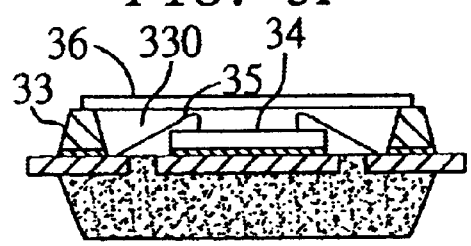

As shown in FIG. 3F, the covering member 36 is bonded on the frame 33 by a conventional adhesive agent (not shown) to seal the hollow portion 330 of the frame 33 and isolate the semiconductor chip 34 and the gold wire 35 from the foreign material or moisture.

SECOND PREFERRED EMBODIMENT

Figure 4:
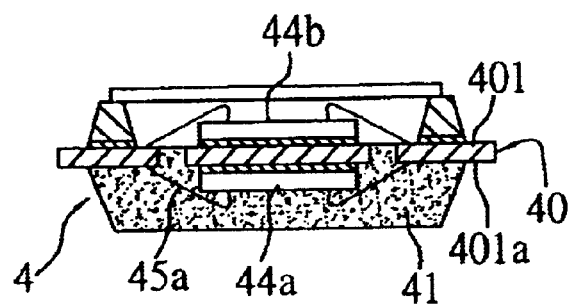
FIG. 4 is a sectional view of the second preferred embodiment of the semiconductor package of the present invention.

Please refer to FIG. 4 which is a sectional view of the second preferred embodiment of the semiconductor package 4 of the present invention. The structure of the second preferred embodiment of the semiconductor package 4 is substantially similar to that of the first preferred embodiment. The only difference is that a semiconductor chip 44a with peripheral pads is attached to the lower surface of the lead frame 40 in the semiconductor package 4 and electrically connected to the bottom surface 401a of the lead 401 through the gold wires 45a. After the resin molded block 41 is formed on the lower surface of the lead frame 40, it can completely cover the semiconductor chip 44a and the gold wires 45a, while a semiconductor chip 44a with peripheral pads and the image-sensing chip 44b are attached to the same lead frame 40 in the semiconductor package 4. Finally, the structure with a multi-chip module is fabricated and can increase the electronic functions and capacity.

The manufacturing process of the second preferred embodiment of the semiconductor package 4 is shown in FIGS. 5A to 5G.

Figure 5A:
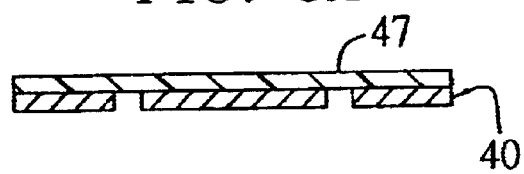
FIGS. 5A to 5G are schematic diagrams showing the flowchart of the method for manufacturing the second preferred embodiment of the semiconductor package of the present invention.

As shown in FIG. 5A, an adhesive tape 47 capable of being easily ripped off is attached to the lead frame 40. Because this step is the same as that described in the first embodiment, detailed description about this part is omitted.

Figure 5B:
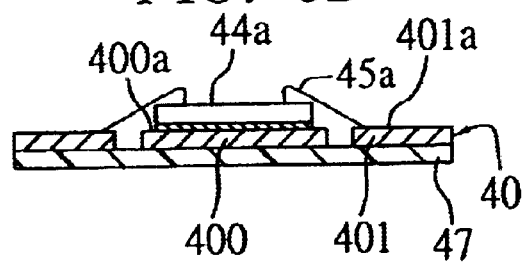

As shown in FIG. 5B, a semiconductor chip 44a with peripheral pads is attached to the bottom surface 400a of the die pad 40 by a conventional silver paste or a similar adhesive agent. Then, the semiconductor chip 44a is connected to the bottom surface 401a of the lead 401 through the gold wires 45a so that the semiconductor chip 44a is electrically connected to the lead 401 through the gold wires 45a.

Figure 5C:
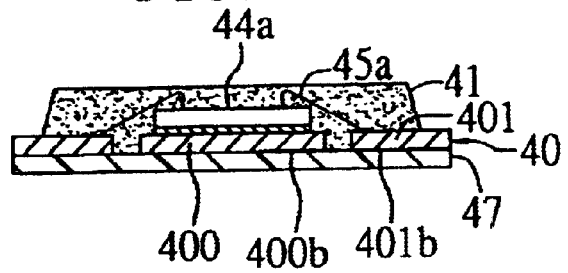

As shown in FIG. 5C, after accomplishing the die-bonding and wire-bonding processes, the lead frame 40 having an adhesive tape 47 attached on the upper surface thereof and having a semiconductor chip 44a attached on the lower surface thereof is placed in the package mold for performing a molding process so as to form a resin molded block 41 on one side of the lead frame 40 which has the semiconductor chip 44a attached thereon and to cover the semiconductor chip 44a and the gold wires 45a therein. Similarly, because the adhesive tape 47 is attached on the upper surface of the lead frame 40, there is no resinous flash formed on the top surface 400b of the die pad 400 and the top surface 401b of the lead 401 during the molding process. After the adhesive tape 47 is removed from the lead frame 40, it does not require any cleaning step to remove the flash on the top surface 400b of the die pad 400 and the top surface 401b of the lead 401 and the subsequent steps can be performed directly.

Figure 5D:
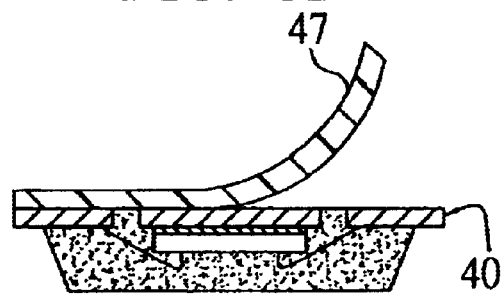
Figure 5E:
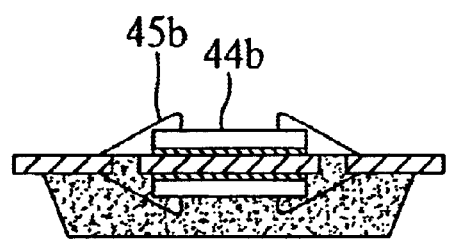
Figure 5F:
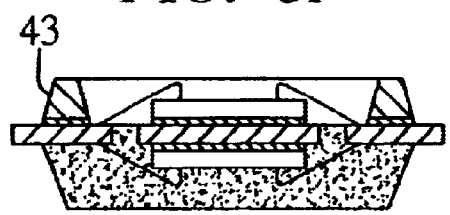
Figure 5G:
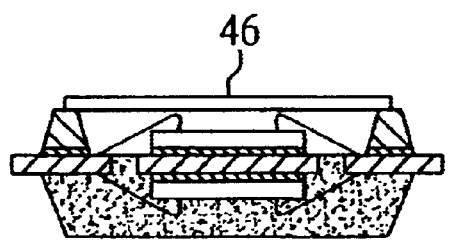

After finishing the above molding process, the step for removing the adhesive tape 47 as shown in FIG. 5D, the step for attaching the image-sensing chip 44b and bonding the gold wires 45b as shown in FIG. 5E, the step for attaching the frame 43 as shown in FIG. 5F, and the step for bonding the covering member 46 as shown in FIG. 5G are identical to those described above so that detailed descriptions for these parts are omitted.

THIRD PREFERRED EMBODIMENT

Figure 6:
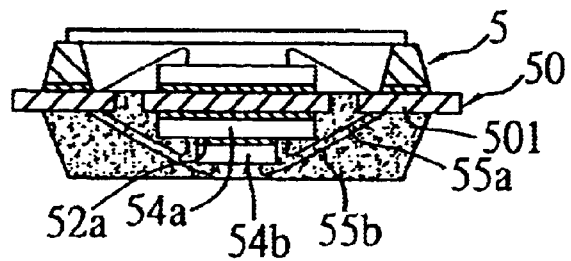
FIG. 6 is a sectional view of the third preferred embodiment of the semiconductor package of the present invention.

FIG. 6 shows a sectional view of the third preferred embodiment of the semiconductor package of the present invention. The structure of the third preferred embodiment of the semiconductor package 5 is substantially similar to that of the first preferred embodiment. The only difference is that the semiconductor package 5 includes the first semiconductor chip 54a and the second semiconductor chip 54b, both of which are attached to the lower surface of the lead frame 50 in a stacked manner. As illustrated, the second semiconductor chip 54b is adhered on the first semiconductor chip 54a by a conventional adhesive agent such as a silver paste, and the first and second semiconductor chips 54a, 54b are electrically connected to the lead 501 through the gold wires 55a, 55b. Such a stacked structure provides the semiconductor package 5 with more electronic functions and yield. Alternatively, the second semiconductor chip 54b can be electrically connected to the first semiconductor chip 54a in a flip-chip manner. Because this flip chip is a well-known technique, detailed description thereof is omitted.

FOURTH PREFERRED EMBODIMENT

Figure 7:
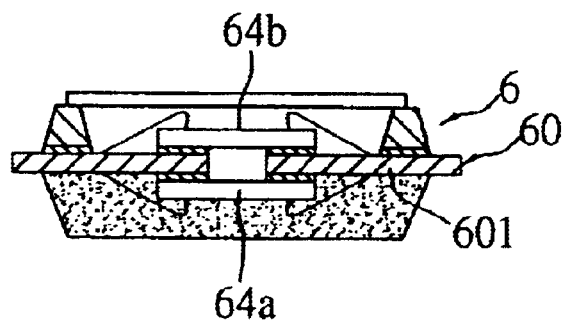
FIG. 7 is a sectional view of the fourth preferred embodiment of the semiconductor package of the present invention.
Figure 8:
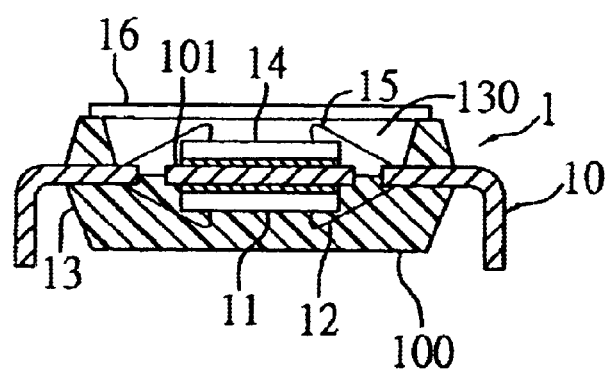
FIG. 8 is a sectional view of a conventional semiconductor package.

FIG. 7 shows a sectional view of the fourth preferred embodiment of the semiconductor package of the present invention. The structure of the fourth preferred embodiment of the semiconductor package 6 is substantially similar to that of the first preferred embodiment. The difference is that the lead frame 60 of the semiconductor package 6 is only constituted by a plurality of leads 601, that is, the semiconductor chips 64a, 64b are directly attached to the leads 601. Because the semiconductor chips 64a, 64b are attached to the leads 601, the attaching area can be significantly reduced and the probability of delamination on the junction between the semiconductor chip 64a or 64b and the leads 601 induced by thermal stress during the package process is lowered, thereby increasing the yield rate and reliability of the fabricated product.

While the invention has been described in terms of what are presently considered to be the most practical and preferred embodiments, it is to be understood that the invention need not be limited to the disclosed embodiments. On the contrary, it is intended to cover various modifications and similar arrangements included within the spirit and scope of the appended claims which are to be accorded the broadest interpretation so as to encompass all such modifications and similar structures.

What is claimed is:

1. A semiconductor package, comprising:

a lead frame having a first surface and a second surface opposite to said first surface;

a resin molded block formed on a predetermined position of said first surface of said lead frame;

a frame attached to a predetermined position of said second surface of said lead frame by an adhesive agent and having a hollow portion for allowing a portion of said second surface of said lead frame exposed in said hollow portion to serve as a chip-adhering region;

a first semiconductor chip attached on said chip-adhering region and electrically connected with said lead frame; and a covering member bonded on said frame to seal said hollow portion for isolating said first semiconductor chip from outside.

2. The semiconductor package according to claim 1 further comprising at least one second semiconductor chip with peripheral pads attached to said first surface of said lead frame wherein said second semiconductor chip is covered by said resin molded block after said resin molded block is formed.

3. The semiconductor package according to claim 1 wherein said frame is attached to said lead frame by an adhesive agent having a relatively good thermal conductivity but no electrical conductivity.

4. The semiconductor package according to claim 3 wherein said adhesive agent is one selected from a group consisting of polyimide and epoxy resin.

5. The semiconductor package according to claim 1 wherein said frame is made of one selected from a group consisting of metal, resin, and glass fiber.

6. The semiconductor package according to claim 1 wherein said lead frame is made of one selected from a group consisting of copper, aluminum, copper alloy, aluminum alloy, and a mixture thereof.

7. The semiconductor package according to claim 1 wherein said lead frame is constituted by a die pad for attaching said first semiconductor chip thereon and a plurality of leads.

8. The semiconductor package according to claim 1 wherein said lead frame is constituted by a plurality of leads for directly attaching said first semiconductor chip.

\* \* \* \* \*